United States Patent
Malamy

(10) Patent No.: US 8,013,765 B1
(45) Date of Patent: Sep. 6, 2011

(54) MODULAR SCALEABLE PROCESSING ENGINE FOR ACCELERATING VARIABLE LENGTH CODING

(75) Inventor: Adam Craig Malamy, San Carlos, CA (US)

(73) Assignee: Cavium, Inc., San Jose, CA (US)

( * ) Notice: Subject to any disclaimer, the term of this patent is extended or adjusted under 35 U.S.C. 154(b) by 0 days.

(21) Appl. No.: 12/150,871

(22) Filed: May 1, 2008

(51) Int. Cl.
*H03M 7/00* (2006.01)

(52) U.S. Cl. .......................................... 341/107; 341/50
(58) Field of Classification Search ............... 341/50, 341/51, 106, 67, 65
See application file for complete search history.

(56) References Cited

U.S. PATENT DOCUMENTS

| | | | | |
|---|---|---|---|---|
| 5,138,315 A | * | 8/1992 | Le Queau et al. | 341/67 |
| 5,381,145 A | * | 1/1995 | Allen et al. | 341/107 |
| 5,424,733 A | * | 6/1995 | Fimoff et al. | 341/67 |
| 5,491,480 A | * | 2/1996 | Jan et al. | 341/67 |
| 5,528,628 A | * | 6/1996 | Park et al. | 375/240 |
| 5,563,920 A | * | 10/1996 | Fimoff et al. | 375/354 |
| 5,568,139 A | * | 10/1996 | Yoon | 341/67 |
| 5,686,916 A | * | 11/1997 | Bakhmutsky | 341/67 |
| 7,054,367 B2 | * | 5/2006 | Oguz et al. | 375/240.23 |
| 7,180,901 B2 | * | 2/2007 | Chang et al. | 370/395.64 |
| 7,224,844 B2 | * | 5/2007 | Otsuka | 382/239 |
| 7,366,165 B2 | * | 4/2008 | Kawarai et al. | 370/366 |
| 7,796,065 B2 | * | 9/2010 | Fenney | 341/107 |
| 2005/0084019 A1 | * | 4/2005 | Chujoh et al. | 375/240.27 |
| 2006/0115000 A1 | * | 6/2006 | Otsuka | 375/240.23 |

* cited by examiner

*Primary Examiner* — Peguy JeanPierre

(57) ABSTRACT

A mechanism for efficient CAVLC coding in a hardware implementation of a H.264 coder is provided. In an embodiment of the present invention, multiple modular CAVLC engines that each process one sub-macroblock of data are used. An assembler engine that combines the CAVLC-encoded sub-macroblock data from each modular CAVLC engine to form a output bit-stream is also provided.

11 Claims, 4 Drawing Sheets

214a

| Data | Count | ID |
|---|---|---|
| | 32 | 0 |
| | 32 | 0 |
| | 32 | 0 |
| | 32 | 0 |
| | 32 | 0 |
| | 32 | 0 |
| | 32 | 0 |
| Etc. | 32 | 0 |
| 1010101001001001010111111001010 | 32 | 0 |
| 1010100100100100101010010101010101 | 32 | 0 |
| ID number for sub-block b0 | | 1 |
| 1001011011xxxxxxxxxxxxxxxxxxxxxx | 10 | 0 |
| 0010100100100100010010101010100111 | 32 | 0 |
| 1110001000100010010100010101010100 | 32 | 0 |
| 1010101010101010001001010101010101 | 32 | 0 |
| 1101101110101111010110111011101111011 | 32 | 0 |
| 0101001010010100101010010101010101 | 32 | 0 |
| 1011001010010101010101010101010101 | 32 | 0 |
| 1010111010101101011010101010101101 | 32 | 0 |
| ID number for sub-block a0 | | 1 |

Head of FIFO (first out)

FIG. 3

MODULAR SCALEABLE PROCESSING ENGINE FOR ACCELERATING VARIABLE LENGTH CODING

FIELD OF THE INVENTION

The present invention relates generally to digital video signal processing, and more specifically to devices for video coding.

BACKGROUND OF THE INVENTION

Video coding standards that make use of several advanced video coding tools and techniques to provide high compression performance are well known in the art. In the past, standards such as MPEG-2, MPEG4, and H.263 have been widely adopted. More recently, H.264 has been widely adopted as it offers better compression performance than other video compression standards. At the core of all these video compression standards are the techniques of motion compensation and transform coding. A diagram illustrating the operational blocks of a video encoder that conforms to the H.264 standard is shown in FIG. 1.

Motion compensation schemes basically assume, for most sequences of video frames, the amount of change from one frame to the next is small. Thus, compression can be achieved by transmitting or storing information in a frame as a difference, or delta, from a previous frame, rather than as an independent image. In this way, only the changes between a new frame and a previous frame need to be captured. The frame used for comparison is called a reference frame.

The specific type of motion compensation schemes used by many video encoding standards, such as H.264 AVC, is called block motion compensation. Block motion compensation schemes typically decompose a frame into macroblocks where each macroblock contains 16×16 luminance values (Y) and two 8×8 chrominance values (Cb and Cr), although other block sizes are also used. These macroblocks are typically processed one at a time. The compression mechanism in a video encoder would attempt to find a macroblock in the reference frame that closely matches the current macroblock of the current frame (motion estimation), and the differences between these two blocks would be transformed and quantized. The transform of a macroblock converts the pixel values of the block from the spatial domain into a frequency domain for quantization. This transformation step may use a two-dimensional discrete cosine transform (DCT) or other transformation methods.

The residual macroblock data generated by the transformation step is then quantized, and then coded by using variable length coding. In H.264, a Context Adaptive Variable Length Coding (CAVLC) scheme or a Context Adaptive Binary Arithmetic Coding (CABAC) scheme can be used for the variable length coding step.

For low-latency H.264 baseline-profile video encoding hardware device (e.g., a mobile phone having wireless video transmission capability, or a security camera), it is desirable to execute CAVLC coding at least as quickly as other stages of the encoder.

SUMMARY OF THE INVENTION

The present invention provides a mechanism for efficient CAVLC coding in a hardware implementation of a H.264 encoder. More specifically, in an embodiment of the present invention, multiple modular CAVLC engines that each process one sub-macroblock (or sub-block) of data are used. An assembler engine that combines the CAVLC-encoded data from each modular CAVLC engine to form a output bitstream is also provided.

In one embodiment, a content-adaptive variable length coder of the present invention includes a plurality of variable length coding engines, where each variable length coding engine processes one sub-block of data at a time. Since multiple variable length coding engines are used, multiple sub-blocks of data are processed in parallel. The outputs of the variable length coding engine are called "variable length coded data sets" herein, where one data set is generated for each sub-block of data. In one embodiment of the invention, each variable length coding engine has its own buffer for storing the variable length coded data sets it produces.

The content-adaptive variable length coder of the present invention further includes an assembler circuit for assembling or "stitching" the data from the variable length coding engines together to form a bitstream. In one embodiment, the assembler circuit retrieves data of one variable length coded data set from one of the buffer and stores the data in an output buffer. Then, the assembler circuit retrieves data of another variable length coded data set from another one of the buffer and stores the data in the output buffer, right after the first data set. In one embodiment of the invention, the order (or sequence) in which the assembler circuit accesses the buffers (and the order in which the variable length data sets are stored in the output buffer) is pre-determined and may depend on the specific variable length coding algorithm that the VLC coder is designed to implement.

BRIEF DESCRIPTION OF THE DRAWINGS

The invention will now be described with reference to the accompanying drawings which illustrate various example embodiments of the invention. Throughout the description, similar reference names may be used to identify similar elements.

FIG. 2B depicts a block diagram of a CAVLC coder according to an embodiment of the present invention.

FIG. 3 depicts data of a pre-assembler buffer according to an embodiment of the present invention.

DETAILED DESCRIPTION OF PREFERRED EMBODIMENTS

Figure 1:
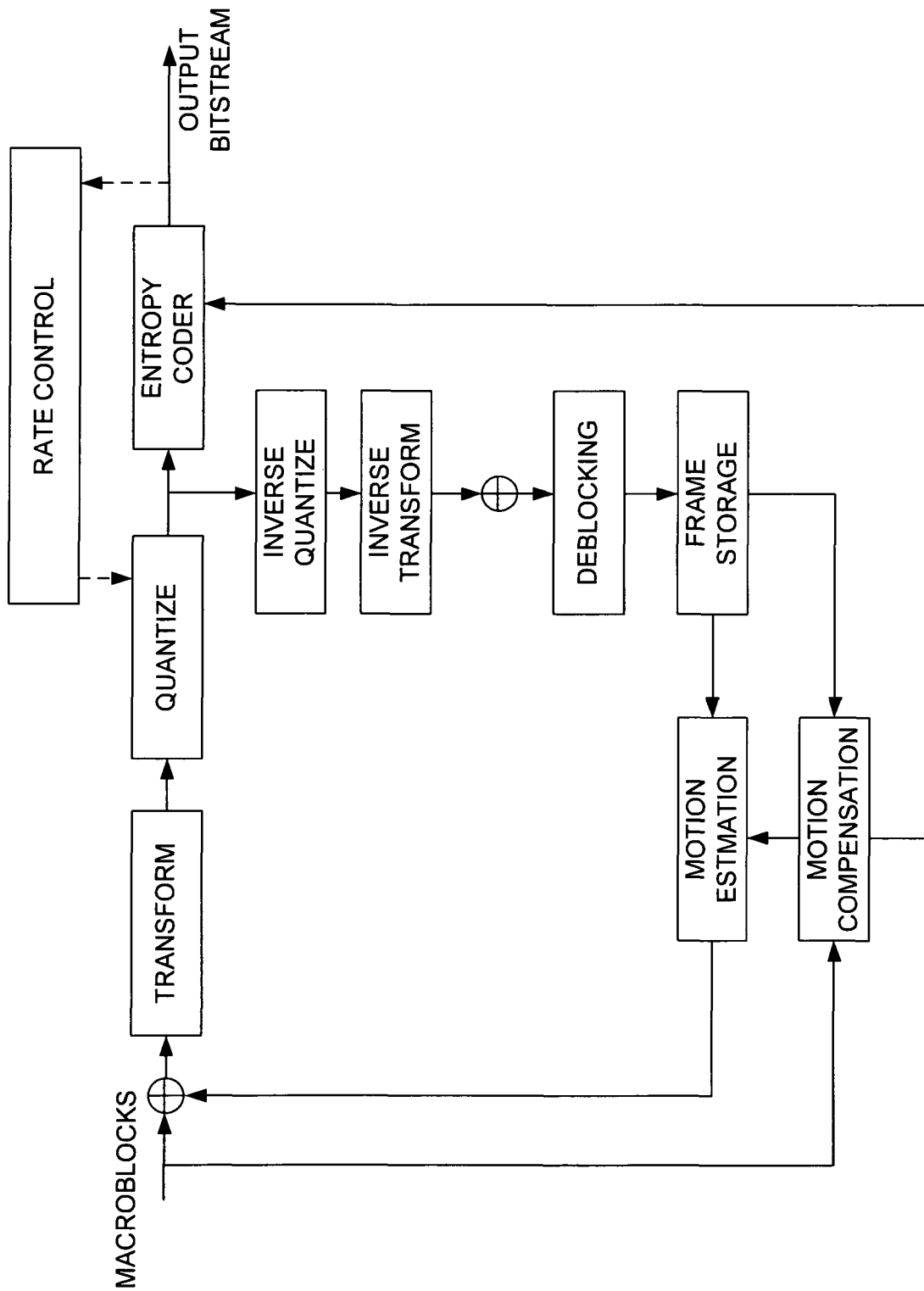
FIG. 1 depicts a block diagram of a typical video encoder.
Figure 2A:
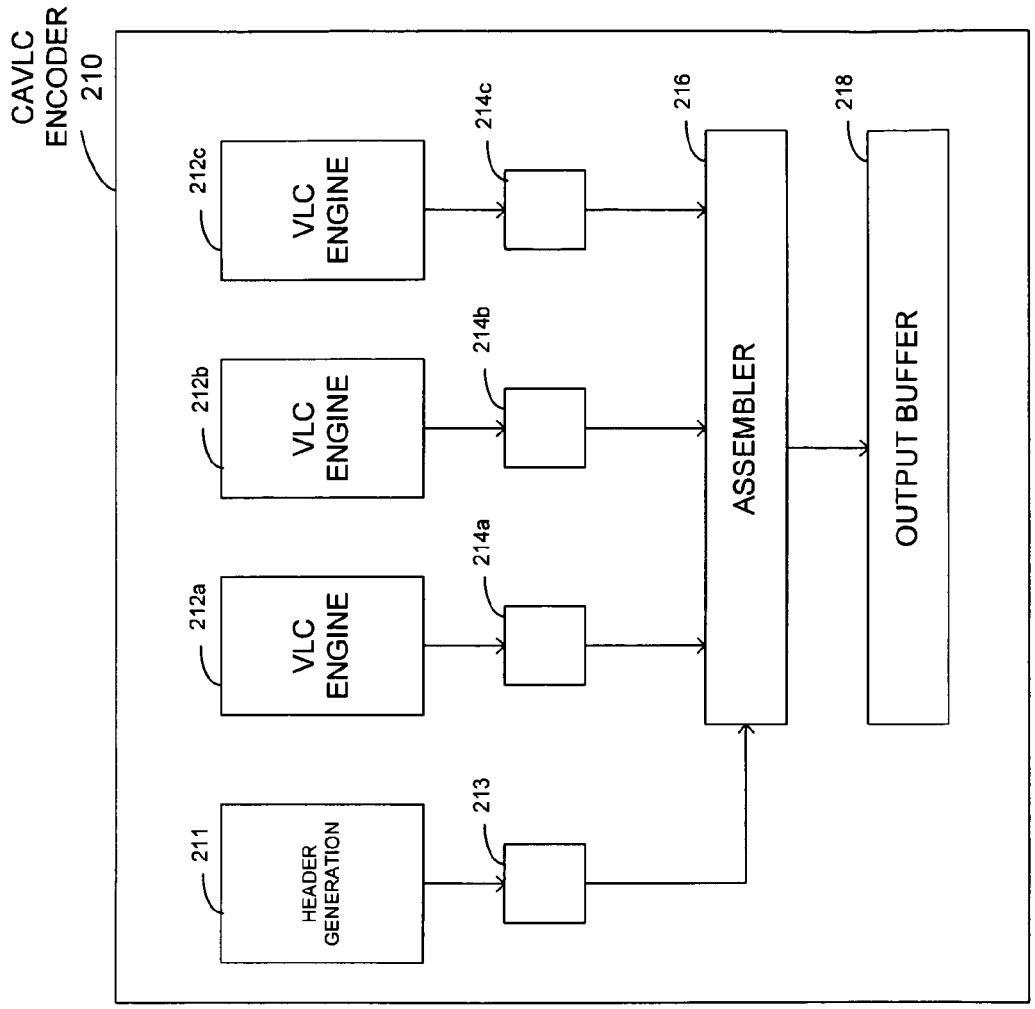
FIG. 2A depicts sub-macroblocks that are assigned to a plurality of various CAVLC engines of the CAVLC of FIG. 2B.
Figure 2A:
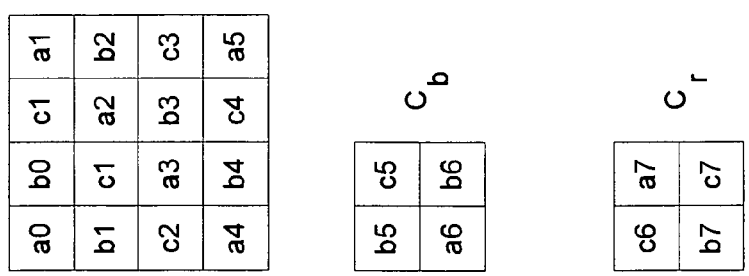

The present invention provides a CAVLC coder that is implemented as a functional unit of a video encoder integrated circuit such as one compliant with H.264. For the purpose of elaborating the operations of the CAVLC coder of the present invention, residual data corresponding to a macroblock (which may be obtained after transformation and quantization) is depicted in FIG. 2A. As shown, the residual data, like the macroblock data from which it is derived, is organized into 16×16 luminance residual values, and two 8×8 chrominance residual values. Further, the residual data is organized into sub-macroblocks (or sub-blocks) each containing 4×4 values in FIG. 2A.

Also illustrated in FIG. 2A, for purposes of elaboration, each sub-block is given a label—a0, b0, c0, a1, b1, c1, a2, b2, etc. These labels identify the specific VLC engines (described further below) that will process the sub-blocks, and an order in which the sub-blocks would be processed. It should be noted that sub-blocks are assigned to the VLC engines according to a specific VLC algorithm that the CAVLC coder 210 is designed to implement. In an actual implementation, the sub-blocks may not be assigned to the VLC engines in a manner as illustrated.

Attention now turns to FIG. 2B, which is a block diagram of a CAVLC coder 210 according to an embodiment of the invention. As shown, the CAVLC coder 210 includes multiple modular VLC engines 212a, 212b and 212c. In accordance with an embodiment of the invention, each VLC engine 212 is responsible for processing certain pre-determined sub-blocks. For instance, VLC engine 212a is responsible for processing sub-blocks a0 to a7; VLC engine 212b is responsible for sub-blocks b0 to b7, and VLC engine 212c is assigned sub-blocks c0 to c7.

It should be noted that the VLC engines 212a-212c each encode one sub-block of data at a time, although the VLC engines 212a-212c may be encoding data at the same time (e.g., in parallel). That is, VLC engine 212a would process sub-block a1, and then a2, and then a3, and so on, while VLC engine 212b would process sub-block b1, and then b2, and then b3, and so on. Depending on the architecture of the input buffer (not shown) that feeds data to the VLC engines 212a-212c, one VLC engine may have to stall and wait for another engine to finish before it can process another sub-block.

According to another embodiment of the invention, a load balancing mechanism may be implemented in the CAVLC coder 210 such that stalling of the VLC engines 212a-212c can be minimized. However, while there are advantages to such mechanisms, the complexity the CAVLC coder 210 would be increased. In another embodiment of the invention, more than three VLC engines can be used to encode sub-block data in parallel. In another embodiment, two VLC engines may be used.

Outputs from the VLC engines 212a-212c are called variable length coded data sets, where each data set corresponds to a sub-block a0 to c7. With reference still to FIG. 2B, the VLC engines 212a-212c are coupled to provide the variable length coded data sets to pre-assembler buffers 214a-214c, respectively. The pre-assembler buffers 214a-214c are coupled to assembler circuit 216 and output buffer 218. After accessing the data sets in the pre-assembler buffers 214a-214c, the assembler circuit 216 stores the data sets in the output buffer 218 in a pre-determined order.

CAVLC coder 210 further includes a header generation unit 211 that receives data such as motion vectors from other functional units of a video coder, and generates header data for each macroblock of CAVLC coded residual data. The header generation unit 211 is coupled to header buffer 213, which stores header data produced by the header generation unit 211. The assembler circuit 216 also accesses the header buffer 213 and stores appropriate header information into the output buffer. Data stored in the output buffer 218, which may be implemented as a First-In-First-Out (FIFO) buffer, can be sequentially read out therefrom to form a bitstream that is compliant with H.264 AVC.

In one embodiment of the invention the pre-assembler buffers 214a-214c may be implemented as FIFO buffers as well. FIG. 3 depicts contents of a pre-assembler buffer 214a in accordance with an embodiment of the present invention. As shown, pre-assembler buffer 214a is a 38-bit wide FIFO buffer. Thirty-two bits of each entry of the FIFO buffer are for storing variable length coded data sets produced by VLC engine 212a. Five-bits of each entry of the FIFO buffer are for storing a value COUNT, which indicates how many bits of data in a data set are stored in the corresponding entry. For example, if an entry contains only ten bits of data (with twenty-two bits of junk data denoted in FIG. 3 as "x"), the value of COUNT would be "10". If an entry is occupied by thirty-two bits of data, the value of COUNT would be "32". At least one bit of each entry of the FIFO buffer is for storing a value ID_FLAG, which indicates whether the entry contains variable length coded data or an identifier that identifies a particular variable length coded data set.

In the example illustrated in FIG. 3, if the entry has an ID_FLAG value 0, it may indicate variable length coded data are stored in the entry; and if the entry has an ID_FLAG value 1, it may indicate that the data stored in the entry is an identifier that identifies a particular sub-block (e.g., sub-block a1). Entries having variable length coded data and following an entry having an ID_FLAG value of 1 are considered to be in the same variable length coded data set. It should be noted that each entry contains data from one variable length coded data set. As mentioned earlier, if data from one variable length coded data set does not occupy the entire data field of the entry, the rest of the data field will contain "junk data." In one embodiment of the invention, a five-bit value is used as an identifier such that each variable length coded data set may be uniquely mapped to a sub-block (e.g., a0 to c7). Note that having the sub-block ID in the pre-assembler buffers enables the assembler to find the next sub-block to process without prior knowledge of which VLC engine processes which sub-block. This allows a load balancer, in some embodiments of the invention, to arbitrarily assign sub-blocks to VLC engines without adversely impacting the operation of the assembler.

Pre-assembler buffers 214b and 214c are similar to pre-assembly buffer 214a, but they are configured to receive data from VLC engines 212b and 212c, respectively. Header buffer 213 may be 37-bit wide for storing thirty-two bits of header data, and five bits of COUNT value to indicate how many bits of actual header data are stored in each entry. In one embodiment of the invention, the output buffer 218 is 32-bit wide. Header data may have a variable length as well. Therefore, in the present embodiment, a COUNT value is used to indicate a last bit of the header data.

Figure 4:
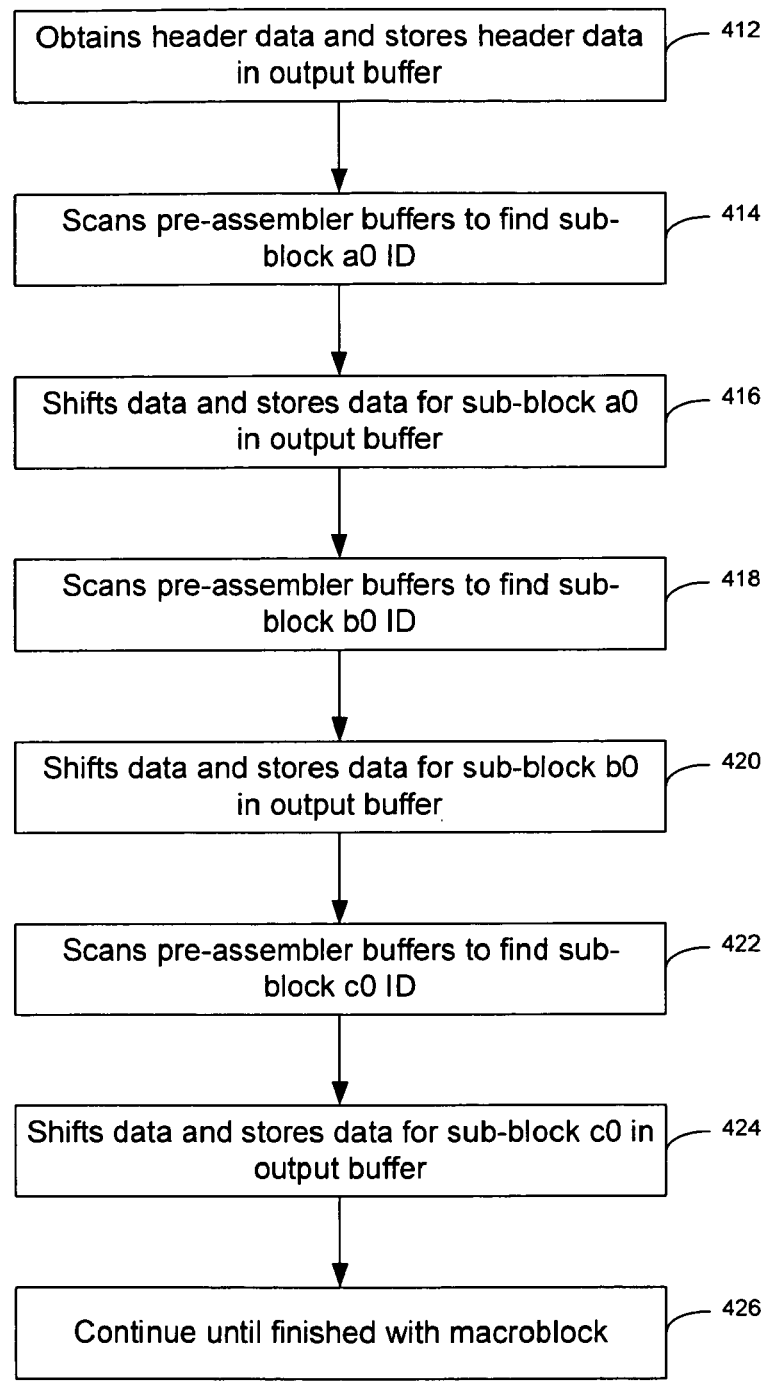
FIG. 4 depicts a flow diagram of the operations of the assembler according to an embodiment of the invention.

With reference now to FIG. 4, a flow diagram 400 of certain operations of the assembler circuit 216 is depicted. At step 412, the assembler circuit 216 accesses the header generator unit (not shown) to obtain header data for a macroblock, and stores the header data in the output buffer 218.

Then, at step 414, the assembler circuit 216 scans pre-assembler buffers 214a-214c to identify which buffer holds the data for the first sub-block, which is sub-block a0. At step 416, the assembler circuit 216 then stores the variable length coded data corresponding to sub-block a0 (excluding COUNT and ID_FLAG) in the output buffer 218. Since data may be read out sequentially from the output buffer 218 to form a H.264 compliant bitstream, it is important to make sure that there are no "skipped bits" or "junk data" between the header data and the first variable length coded data set, and between subsequent variable length coded data sets. In one embodiment of the invention, the assembler circuit 216 shifts the variable length coded data by the same number of bits as indicated by the COUNT value in the last entry of the header data before storing the variable length coded data in the output buffer 218.

At step 418, the assembler circuit 216 scans pre-assembler buffers 214a-214c to identify which buffer holds the data for the second sub-block, which is sub-block b0. At step 420, the assembler circuit 216 then stores the variable length coded data corresponding to sub-block b0 (excluding COUNT and ID_FLAG) in the output buffer 218. As in step 416, the assembler circuit 216 shifts the variable length coded data corresponding to sub-block b0 by the same number of bits as indicated by the COUNT value in the last entry for sub-block a0, thus ensuring that there is no "gap" between last bit of sub-block a0 and the first bit of sub-block b0.

At step 422, the assembler circuit 216 scans pre-assembler buffers 214*a*-214*c* to identify which buffer holds the data for the first sub-block, which is sub-block c0. At step 424, the assembler circuit 216 then stores the variable length coded data corresponding to sub-block c0 (excluding COUNT and ID_FLAG) in the output buffer 218. As in steps 416 and 420, the assembler circuit 216 shifts the variable length coded data corresponding to sub-block c0 by the same number of bits as indicated by the COUNT value in the last entry for sub-block b0, thus ensuring that there is no "gap" between last bit of sub-block b0 and the first bit of sub-block c0.

According to an embodiment of the invention, at step 426, steps 412 to 424 are repeated for VLC coded data corresponding to sub-blocks a1, b1, c1, a2, b2, c2, a3, b3, c3, etc., until all the VLC coded data for the macroblock are stored in the output buffer 218. This process is then repeated for another macroblock until an entire frame is coded.

In this way, by using multiple instances of VLC engine and an assembler circuit to "stitch" the outputs back into a bitstream, residual data can be efficiently coded using a CAVLC algorithm.

Embodiments of the invention have thus been disclosed. The foregoing descriptions of specific embodiments of the invention are presented for purposes of illustration and explanation. The embodiments were chosen and described in order to best explain the principles of the invention and its practical applications, to thereby enable others skilled in the art to best utilize the invention. They are not intended to be exhaustive or to limit the invention to the precise forms disclosed. Various modifications may occur to those skilled in the art having the benefit of this disclosure without departing from the inventive concepts described herein. In other instances, well known structures and devices have not been illustrated or described in detail in order to avoid obscuring aspects of the invention. It is the claims, not merely the foregoing illustration, that are intended to define the exclusive rights of the invention.

Furthermore, throughout this specification (including the claims), unless the context requires otherwise, the word "comprise", or variations such as "comprises" Or "comprising", will be understood to imply the inclusion of a stated element or group of elements but not the exclusion of any other element or group of elements. The word "include," or variations such as "includes" or "including," will be understood to imply the inclusion of a stated element or group of elements but not the exclusion of any other element or group of elements. Claims that do not contain the terms "means for" and "step for" are not intended to be construed under 35 U.S.C. §112, paragraph 6.

What is claimed is:

1. A content-adaptive variable length coder, comprising:
a plurality of variable length coding engines for performing variable length coding operations on a like plurality of sub-blocks of residual data in parallel to produce a like plurality of variable length output data sets;
a like plurality of buffers coupled to the variable length coding engines, each one of the buffers storing one of the plurality of variable length output data sets;
an assembler circuit coupled to the plurality of buffers to retrieve the plurality of variable length output data sets one set at a time and in a pre-determined order that is prioritized at least in part based on data stored in the buffers; and
an output buffer coupled to the assembler circuit, wherein the assembler circuit stores the variable length output data sets in the output buffer one data set at a time in the pre-determined order.

2. The content-adaptive variable length coder of claim 1, wherein entries of the buffers each comprise a COUNT field.

3. The content-adaptive variable length coder of claim 2, wherein the COUNT field of an entry is for indicating a number of bits of data stored in the data field of the entry.

4. The content-adaptive variable length coder of claim 3, wherein entries of the buffers each comprise an ID_FLAG field, and wherein the pre-determined order is prioritized at least in part based on the ID_FLAG field.

5. The content-adaptive variable length coder of claim 4, wherein an ID_FLAG field of an entry is for indicating whether the entry contains an identifier for uniquely identifying the variable length output data sets.

6. The content-adaptive variable length coder of claim 3, wherein the variable length output data sets stored in the output buffer are tightly packed to form a bit stream.

7. The content-adaptive variable length coder of claim 5, wherein entries of the buffers each comprise a data field.

8. The content-adaptive variable length coder of claim 7, wherein the data field is configured to store data of one of the variable length output data sets.

9. The content-adaptive variable length coder of claim 7, wherein the data field of each entry comprises data from at most one set of the variable length output data sets.

10. The content-adaptive variable length coder of claim 5, further comprising:
a header generation unit for generating header data; and
a header data buffer for storing the header data.

11. The content-adaptive variable length coder of claim 10, wherein the assembler circuit retrieves the header data from the header data buffer and stores the header data in the output buffer.

* * * * *